US006927082B1

(12) United States Patent
Sivakumar et al.

(10) Patent No.: US 6,927,082 B1
(45) Date of Patent: Aug. 9, 2005

(54) METHOD OF EVALUATING THE QUALITY OF A CONTACT PLUG FILL

(75) Inventors: Swaminathan Sivakumar, Portland, OR (US); Oleg Golonzka, Beaverton, OR (US); Timothy F. Crimmins, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/797,672

(22) Filed: Mar. 10, 2004

(51) Int. Cl.[7] ............................................. H01L 21/66
(52) U.S. Cl. ......................... 438/14; 438/16; 438/17; 438/466; 438/672; 438/675; 438/685; 438/705; 438/745; 438/754
(58) Field of Search ............................. 438/14, 16–17, 438/466, 672, 675, 685, 705, 745, 754

(56) References Cited

U.S. PATENT DOCUMENTS

| | | | |
|---|---|---|---|
| 5,804,249 A | * | 9/1998 | Sukharev et al. ............. 427/99 |
| 6,103,615 A | * | 8/2000 | Sugasawara et al. ........ 438/622 |
| 6,278,129 B1 | * | 8/2001 | Sugasawara et al. .......... 257/48 |
| 2002/0036351 A1 | * | 3/2002 | Suh et al. .................... 257/774 |
| 2002/0168812 A1 | * | 11/2002 | Oda et al. ................... 438/200 |

* cited by examiner

Primary Examiner—Lynne A. Gurley
(74) Attorney, Agent, or Firm—Trop, Pruner & Hu, P.C.

(57) ABSTRACT

Defective contact plug fills can be detected by applying an etching solution, which in some embodiments preferentially etches in the <111> direction. The etching solution is some embodiments may also produce a characteristic type of undercutting underneath the contact plug fill. Contact plug fills with defects in them have undercutting underneath as a result of the etchant exposure, while defective contact plug fills have no such undercutting. The contact plug fills that are now undercut by etching exposure are unable to dissipate surface charge or surface applied potential and can be detected using voltage contrast methods or conventional electrical testing techniques, for example.

23 Claims, 2 Drawing Sheets

METHOD OF EVALUATING THE QUALITY OF A CONTACT PLUG FILL

BACKGROUND

This invention relates generally to processes for manufacturing semiconductor integrated circuits.

Semiconductor integrated circuits undergo a process called contact plug fill. In this process, a dielectric material is processed. Contact holes or trenches are patterned into the dielectric. These holes or trenches are then filled with a conducting fill material to form contact plugs.

In some cases, some of the plugs are well filled with the conducting material, while others may have gaps or seams in them. This is an undesirable feature which may reduce the yield of the resulting semiconductor integrated circuit.

Thus, there is a need for ways to evaluate the quality of the contact plug fill.

DETAILED DESCRIPTION

Figure 1:
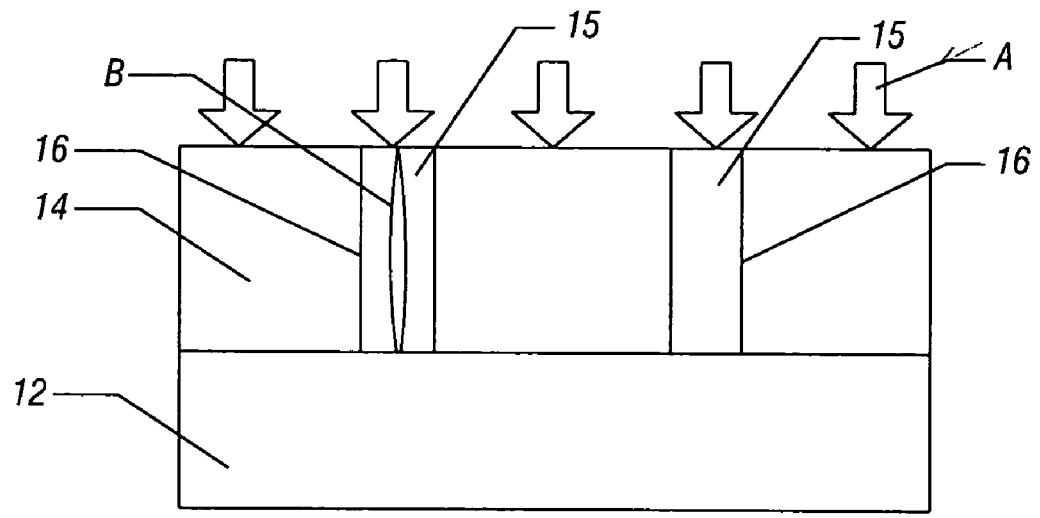
FIG. 1 is an enlarged, cross-sectional view at one stage of evaluation in accordance with one embodiment of the present invention.

Referring to FIG. 1, a semiconductor wafer may include a substrate 12 covered by a dielectric layer 14. A contact hole or trench 16 may be filled with a plug material 15 which may be any conductive material. In the trench 16 on the left, the plug material has a defect B. The defect arises from incomplete filling of the trench 16.

Figure 2:
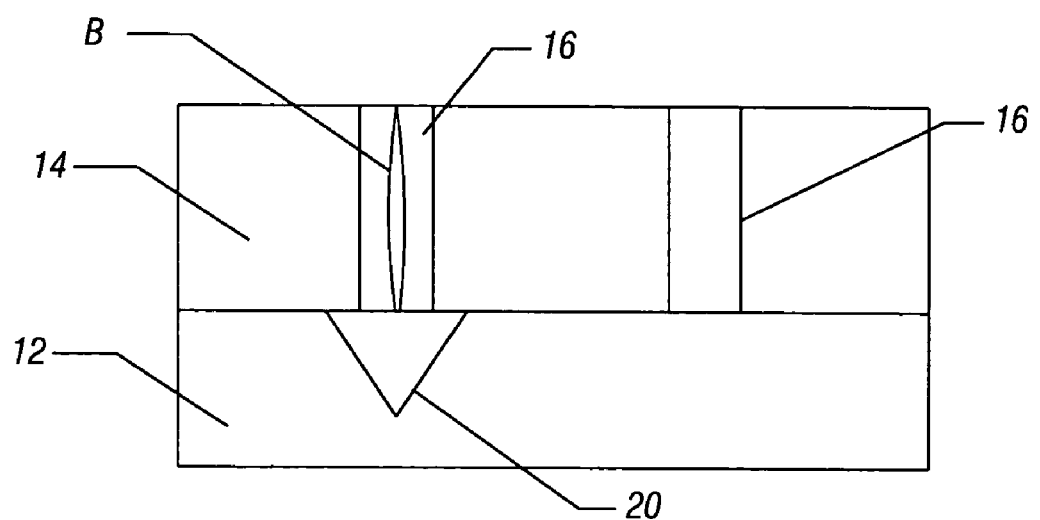
FIG. 2 is an enlarged, cross-sectional view at a subsequent stage of evaluation in accordance with one embodiment of the present invention.

In order to expose the defect, a basic solution may be applied to the wafer, as indicated by the arrows A. In one embodiment, the basic solution is one that penetrates the poorly filled trenches 16 and etches the substrate 12 underneath those trenches along the <111> crystal direction. In one embodiment, a characteristic V-shaped etched region 20 may be left beneath the contacts in the substrate 12 as shown in FIG. 2. An example of one basic solution is potassium hydroxide.

On the other hand, the trench 16 on the right side, with no defects, exhibits no such characteristic etch region 20. The trenches 16 that have the V-shaped etched region 20 do not have adequate electrical contact to the substrate 12 as a result of the V-shaped etched region 20. The trenches 16 with good fill have excellent electrical contact to the substrate 12.

Figure 3:
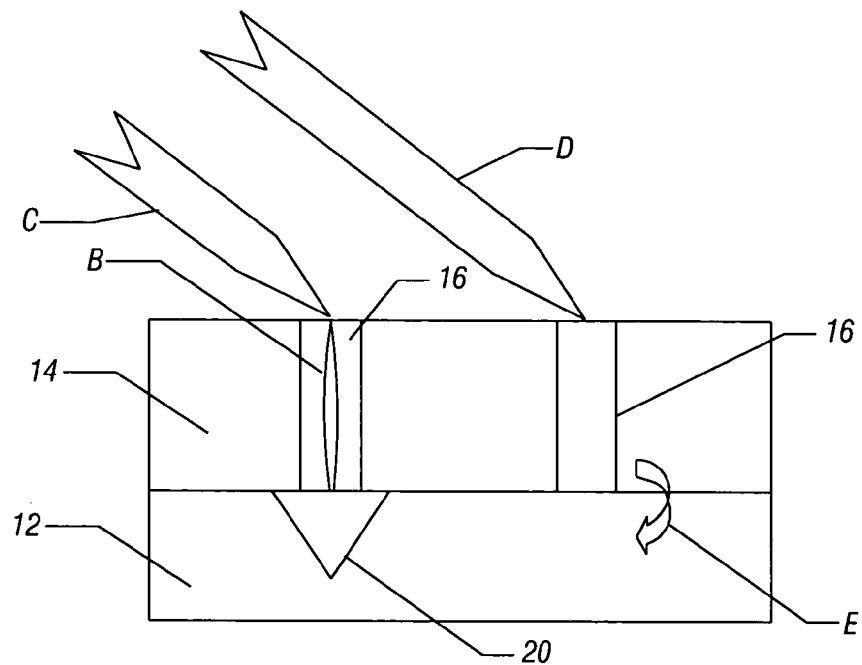
FIG. 3 is an enlarged, cross-sectional view at still a subsequent stage of evaluation in accordance with one embodiment of the present invention.

Referring to FIG. 3, a defect may be detected using voltage contrast-based defect inspection in one embodiment. No further processing of the wafer itself may be needed in some embodiments. In order to detect the poorly filled trenches 16, a charge is induced on the surface of the wafer by an electron beam using the probes C and D. The trenches 16 that have good fill have good electrical contact to the substrate 12 and, thereby, dissipate the surface charge, as indicated by the arrow E in FIG. 3. The trenches 16 that have poor fill and have the V-groove etched out region 20 under them have poor electrical contact to the substrate 12 and are unable to dissipate the surface charge.

A secondary electron image of the wafer is generated using scanning electron microscopy or electron beam wafer inspection. In a secondary electron image, defective trenches 16 are visually distinct from the good trenches 16 due to the influence of the surface charge on the secondary electron emission. The defective trenches 16 can therefore be detected through this voltage contrast-based inspection technique.

Figure 4:
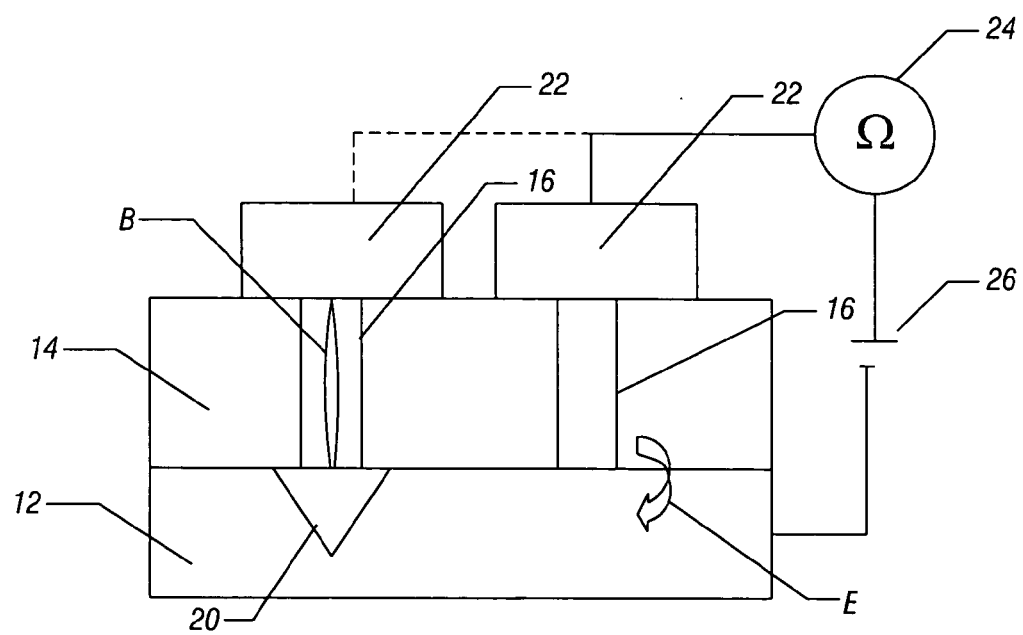
FIG. 4 is an enlarged, cross-sectional view at a subsequent stage of evaluation in accordance with another embodiment of the present invention.

Referring to FIG. 4, in accordance with another embodiment of the present invention, electrical methods may be used to detect the defects as well. Subsequent wafer processing forms interconnect metallizations 22. Standard, post processing electrical test techniques may be used to detect the open circuits in the trenches 16 that have poor fill and, consequently, have the V-shaped etched region 20. Thus, a conventional ohmmeter 24 and voltage source 26 may be used in accordance with well established semiconductor wafer electrical testing techniques to locate the defective trenches 16.

In some embodiments of the present invention, only a short, inexpensive, process flow may enable testing. The turn-around may quick in comparison to other techniques for testing such wafers. Large amounts of quantitative data may be obtained to evaluate fill characteristics due to the large sample areas that may be examined. Well known contrast microscopy-based defect inspection or electrical techniques may be utilized in some embodiments.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   exposing a contact plug fill to an etching solution; and
   exposing the surface of said contact plug fill to an electrical charge using voltage contrast-based defect inspection.

2. The method of claim 1 including exposing the contact plug fill to a basic solution.

3. The method of claim 1 including exposing the contact plug fill to a solution that preferably etches along the <111> crystallographic orientation.

4. The method of claim 1 including using an etching solution that etches a characteristic etch pattern under the contact plug fill if the contact plug fill is defective.

5. The method of claim 1 including determining which contact plug fill dissipates surface charge and which contact plug fill does not dissipate surface charge.

6. A method comprising:
   forming a conductive material in an aperture in a dielectric layer; and
   applying an etching solution to said conductive material that preferentially etches along the <111> crystallographic direction to determine whether the conductive material is defective.

7. The method of claim 6 including exposing a contact plug fill to an etching solution.

8. The method of claim 6 including applying an etching solution which characteristically etches underneath the conductive material if the conductive material is defective.

9. The method of claim 6 including applying a basic solution to said conductive material.

10. The method of claim 9 including applying an etching solution that etches a V-shaped trench under a defective conductive material.

11. The method of claim 6 including exposing the surface of said conductive material to an electric charge.

12. The method of claim 11 including using voltage contrast-based defect inspection.

13. The method of claim 11 including using a secondary electron image to determine if said conductive material is defective.

14. The method of claim 6 including applying a contact to said conductive material.

15. The method of claim 14 including using electrical testing to determine if said conductive material is defective.

16. A method comprising:
forming a contact plug fill in a dielectric layer;
applying a basic solution to said contact plug fill to etch a V-shaped trench under a defective fill; and
determining whether the region underneath the contact plug is etched by said basic solution.

17. The method of claim 16 including applying a basic solution which characteristically etches underneath the contact plug fill if the fill is defective.

18. The method of claim 17 including using electrical testing to determine if said fill is defective.

19. The method of claim 16 wherein applying a basic solution includes exposing the contact plug fill to a solution that preferentially etches along the <111> crystallographic direction.

20. The method of claim 16 including exposing the contact plug fill to an electric charge.

21. The method of claim 20 including using voltage contrast-based defect inspection.

22. The method of claim 20 including using a secondary electron image to determine if said fill is defective.

23. The method of claim 16 including applying a contact to said contact plug fill.

* * * * *